Feb. 12, 1963 J. J. BOHRER ETAL 3,077,511

PRINTED CIRCUIT UNIT

Filed March 11, 1960

INVENTORS
JOHN J. BOHRER
WILLIAM F. EBLING, JR.
BENJAMIN J. PATTON
BY
Donald S. Cohen
ATTORNEY United States Patent Office 3,077,511

Patented Feb. 12, 1963

3,077,511

PRINTED CIRCUIT UNIT

John J. Bohrer, Penn Valley, William F. Ebling, Jr., Springfield, and Benjamin J. Patton, Willow Grove, Pa., assignors to International Resistance Company, Philadelphia, Pa.

Filed Mar. 11, 1960, Ser. No. 14,436

6 Claims. (Cl. 174—68.5)

The present invention relates to a printed circuit unit, and more particularly to an electrical conductor for a printed circuit unit.

In printed circuit units it is often desirable to provide an electrical connection through the base panel of the unit from one side of the base panel to the other side thereof. This is particularly desirable in a microcircuit unit wherein space requirements often necessitate using both sides of the base panel, and the individual circuit elements or components on opposite sides of the base panel must be interconnected. The term "microcircuit" as used herein means any printed circuit utilizing miniature components applied to or deposited upon a substrate or base panel of desired electrical and mechanical properties, which circuit will perform the function of a completed electronic circuit.

In the type of printed circuit unit in which the base panel comprises a sheet of plastic, electrical connection through the base panel from one side of the base panel to the other side thereof has been achieved by means of metal eyelets or rivets which are secured in holes in the base panel. However, in microcircuit units, which are normally very small in size, and in printed circuit units which use a base plate of a ceramic or glass material, metal eyelets or rivets cannot be readily used for making the electrical connections. In the small microcircuit units, the metal eyelets or rivets take up too much area on the base plate. When using a ceramic or glass base plate, it is difficult to attach a metal rivet or eyelet to the ceramic base plate without damaging the base plate. Furthermore, it is often desirable to provide the electrical connection through the base plate without leaving a hole or opening in the base plate.

Another problem in the construction of microcircuit units is in the manner of electrically connecting the circuits of a plurality of the microcircuit units which are stacked one on top of the other. In such a stacked arrangement of microcircuit units, it is necessary to electrically connect one or more points of the circuit of one unit with points on the circuit of the adjacent units while insulating the remaining portions of the circuits from each other. The manner of electrically connecting such units should provide for ease of assembly, and provide a completed stacked assembly which takes up the minimum amount of space.

It is an object of the present invention to provide a novel printed circuit unit.

It is another object of the present invention to provide a novel electrical connection between the sides of the base plate of a printed circuit unit.

It is still another object of the present invention to provide an electrical connection between the sides of a base plate of a printed circuit unit which forms a part of the base plate so that the base plate is free of openings or holes therethrough.

It is a further object of the present invention to provide a novel arrangement of stacked printed circuit units.

It is a still further object of the present invention to provide a novel electrical connection between the circuits on stacked printed circuit units.

It is a still further object of the present invention to provide a stacked arrangement of electrically connected printed circuit units which is relatively easy to assemble, and which takes up a minimum amount of space.

Other objects will appear hereinafter.

For the purpose of illustration the invention there is shown in the drawings forms which are presently preferred; it being understood, however, that this invention is not limited to the precise arrangements and instrumentalities shown.

Figure 1:
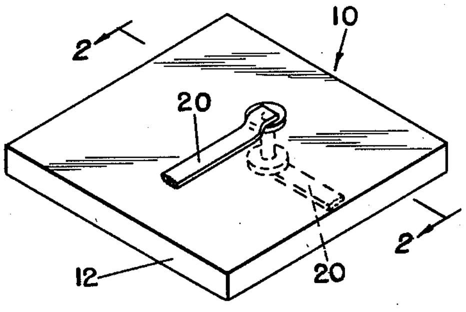
FIGURE 1 is a perspective view of a printed circuit unit of the present invention.
Figure 2:
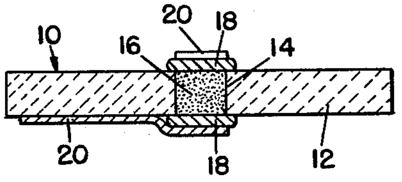
FIGURE 2 is a sectional view taken along line 2—2 of FIGURE 1.

Referring initially to FIGURES 1 and 2, the printed circuit unit of the present invention is generally designated as 10.

Printed circuit unit 10 comprises a relatively thin, flat base plate 12 of an electrical insulating material, such as a plastic, or in the case of a microcircuit unit a ceramic or glass. The base plate 12 has a hole 14 therethrough which is completely filled with the conductor 16. The conductor 16 comprises a mixture of a powdered electrically conductive metal, such as silver, and a binding material which is the same as or similar to the material of the base plate 12. Since the purpose of the binding material is to secure the mixture of the conductor 16 to the base plate 12 within the hole 14, the binding material must be of a material which will strongly adhere to the wall of the hole 14 in the base plate 12. Thus, if the base plate 12 is of a plastic, the binding material of the mixture of the conductor 16 may be of the same plastic as the base plate 12. If the base plate 12 is of a ceramic or glass, the binding material is preferably a glass frit, such as an alkaline earth borosilicate. When forming the printed circuit unit 10, the hole 14 in the base plate 12 is completely filled with the mixture of the conductor 16, and the binding material of the mixture is set to secure the conductor 16 to the wall of the hole 14. If the binding material of the mixture of the conductor 16 is a glass frit, the mixture is fused at the melting temperature of the frit. If the binding material of the mixture is a plastic, the plastic is hardened in a manner according to whether the plastic is thermoplastic or thermosetting.

The mixture of the conductor 16 should include a sufficient amount of the conductive metal particles to permit the conductor 16 to conduct an electrical current. For this purpose, it has been found that the mixture for the conductor 16 should include approximately 75% to 90% conductive metal particles, and from 10% to 25% of the binding material.

The base plate 12 is provided with terminal areas 18 which extend across the ends of the conductor 16. The terminal areas 18 are thin films of an electrically conductive metal. The conductive areas 18 may be applied to the base plate 12 by painting, spraying, or the like, but it is preferable to apply the terminal areas 18 by the process of evaporation of a metal in a vacuum. The metal terminal areas 18 which are evaporated onto the base plate 12 not only adhere better to the base plate, but they also make better electrical connection to the conductive metal particles of the mixture of the conductor 16. As shown in FIGURE 1, the conductive stripes 20 which form the pattern of the printed circuit overlap the terminal areas 18. Thus, the conductive stripes 20 are electrically connected through the terminal areas 18 and the conductor 16 so that the circuit patterns on the opposite sides of the base plate 12 are electrically connected. The conductive stripes 20 may be applied to the base plate 12 simultaneously with the terminal areas 18 so that each terminal area 18 is a continuation of a conductive stripe 20. Although the printed circuit unit 10 of the present invention is shown as having only one conductor 16 extending through the base plate 12, the base plate 12 may be provided with any desired number of conductors 16 according to the number of interconnections required between the circuit patterns on opposite sides of the base plate 12.

Figures 3, 4, 5:
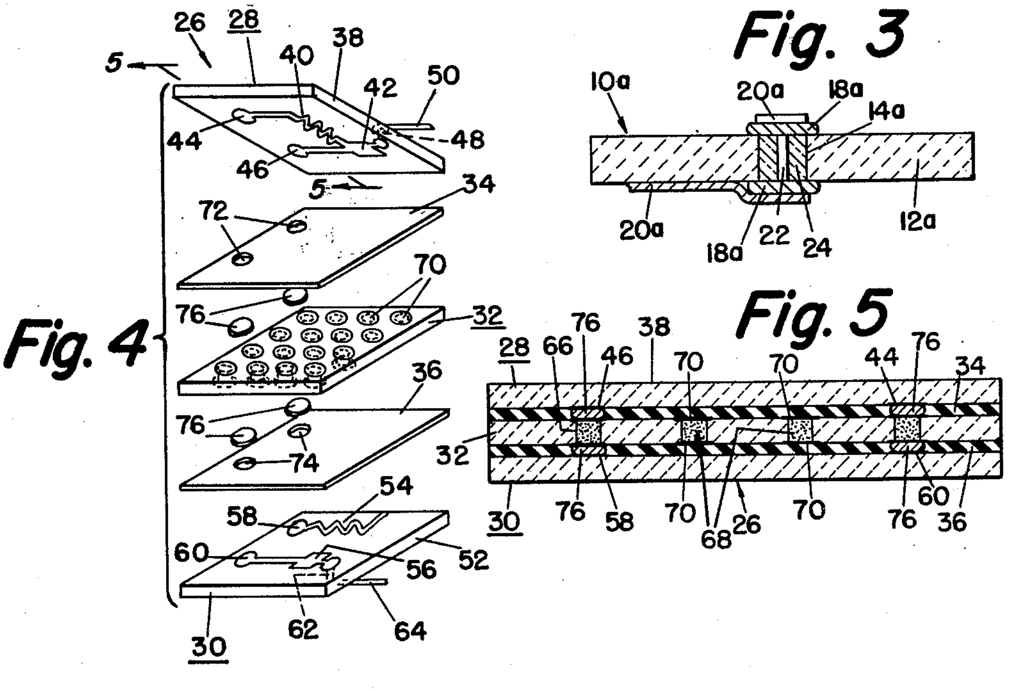
FIGURE 3 is a sectional view similar to FIGURE 2 but showing a modification of the printed circuit unit of the present invention.
FIGURE 4 is an exploded perspective view of a stacked arrangement of printed circuit units of the present invention.
FIGURE 5 is a sectional view taken along line 5—5 of FIGURE 4 with the stacked printed circuit units being in their assembled position.

Referring to FIGURE 3, a modification of the printed circuit unit of the present invention is generally designated as 10*a*. Printed circuit unit 10*a* comprises a base plate 12*a* having a hole 14*a* therethrough. A conductor 22 extends through and is secured in the hole 14*a* in the base plate 12*a*. The conductor 22 comprises a wire of an electrically conductive metal. The conductor 22 is secured in the hole 14*a* by a binding material 24. The binding material 24 is of a material the same as or similar to the material of the base plate 12*a*. Thus, if the base plate 12*a* is a plastic, the binding material 24 may be the same plastic, and if the base plate 12*a* is a ceramic or glass, the binding material 24 is preferably a glass frit. The conductor 22 is of a length so that the ends of the conductor 22 are flush with the surfaces of the base plate 12*a*. Terminal areas 18*a* of an electrically conductive metal are coated on opposite surfaces of the base plate 12*a*, and extend across and electrically contact the ends of the conductor 22. The electrically conductive strips 20*a* which form the circuit pattern overlap the terminal areas 18*a* so that the conductive strips 20*a* are electrically connected by the conductor 22.

Referring to FIGURES 4 and 5, the stacked printed circuit arrangement of the present invention is generally designated as 26. The stacked arrangement 26 comprises a pair of printed circuit units 28 and 30, an interconnecting plate 32, and a pair of insulating sheets 34 and 36.

The printed circuit unit 28 comprises a base plate 38 of an electrical insulating material, such as a plastic, ceramic, or glass. The base plate 38 has a printed circuit pattern provided on one or both sides thereof. As shown in FIGURE 4, the base plate 38 includes on one side thereof a printed circuit pattern which includes a resistor 40 and a plate of a capacitor 42. The resistor 40 and the capacitor 42 are connected by conductive strips to conductive terminal areas 44 and 46 respectively. The base plate 38 also includes a conductor 48 extending through the base plate 38 and electrically connecting the capacitor 42 to a terminal wire 50. The conductor 48 may be either the conductive particle type shown in FIGURE 2, or the conductive wire type shown in FIGURE 3.

The printed circuit unit 30 comprises a base plate 52 of an electrical insulating material, such as a plastic, ceramic, or glass. The base plate 52 is provided with a printed circuit pattern on one or both sides thereof. As shown in FIGURE 4, the printed circuit pattern on one side of the base plate 52 includes a resistor 54, and the plate of a capacitor 56. The resistor 54 and the capacitor 56 are electrically connected to electrically conductive terminal areas 58 and 60 respectively. The base plate 52 is also provided with a conductor 62 extending therethrough, and electrically connecting the capacitor 56 to a terminal wire 64.

The interconnecting plate 32 comprises a thin, flat plate of an electrical insulating material, preferably of the same material as the base plates 38 and 52 of the printed circuit units 28 and 30. The interconnecting plate 32 is provided with a plurality of holes 66 therethrough which are arranged in a uniform manner. Each of the holes 66 of the interconnecting plate is filled with a conductor 68. As shown in FIGURE 5, each of the conductors 68 comprises a mixture of electrically conductive particles and a binder, such as a plastic or a glass frit. However, each of the conductors 68 may also comprise an electrically conductive wire secured in the hole 66 by a binder, such as a plastic or a glass frit. The interconnecting plate 32 is provided on both of its sides with a plurality of terminal areas 70, which terminal areas 70 are thin films of an electrically conductive metal. Each of the terminal areas 70 extends across an end of a separate one of the conductors 68.

The terminal areas 44, 46, 58 and 60 on the printed circuit units 28 and 30 are positioned on the base plates 38 and 52 so that when the printed circuit units 28 and 30 are placed in overlapping, stacked arrangement, the terminal areas 44 and 46 of the printed circuit unit 28 are in direct alignment with the terminal areas 60 and 58 respectively of the printed circuit unit 30. The terminal areas 44, 46, 58 and 60 are also arranged so that when the interconnecting plate 32 is placed between the printed circuit units 28 and 30, the terminal area 44 of the printed circuit unit 28 and the terminal area 60 of the printed circuit unit 30 are in direct alignment with the terminal areas 70 at the opposite ends of one of the conductors 68 through the interconnecting plate 32, and the terminal areas 46 and 58 are in direct alignment with the terminal areas 70 of another one of the conductors 68. Thus, the terminal areas 44 and 46 of the printed circuit unit 28 are in position to be electrically connected to the terminal areas 60 and 58 respectively of the printed circuit unit 30 by two of the conductors 68 of the interconnecting plate 32.

The insulating sheets 34 and 36 are each thin sheets of an electrical insulating plastic. The insulating sheet 34 is sandwiched between the printed circuit unit 28 and the interconnecting plate 32, and is provided with two holes 72 therethrough. The holes 72 are positioned in direct alignment with the terminal areas 44 and 46 of the printed circuit unit 28 so that the terminal areas 44 and 46 are exposed to the two separate terminal areas 70 on the interconnecting plate 32. The insulating sheet 36 is sandwiched between the printed circuit unit 30 and the interconnecting plate 32, and is provided with a pair of holes 74 therethrough. The holes 74 are positioned in direct alignment with the terminal areas 58 and 60 on the printed circuit unit 30 so as to expose the terminal areas 58 and 60 to the terminal areas 70 on the interconnecting plate 32. Thus, the insulating sheets 34 and 36 insulate from the contact areas 70 on the interconnecting plate 32 all of the printed circuit patterns on the printed circuit units 28 and 30 except for the terminal areas 44, 46, 58, and 60. Each of the terminal areas 44, 46, 58 and 60 is electrically connected to its respective terminal area 70 on the interconnecting plate 32 by electrically conductive solder 76 which extends through the holes 72 and 74 in the insulating sheets 34 and 36.

To assemble the stacked printed circuit assembly 26 of the present invention, the printed circuit units 28 and 30, the interconnecting plate 32, and the insulating sheets 34 and 36 are stacked one on top of each other with the interconnecting plate 32 being between the printed circuit units 28 and 30, and the insulating sheets 34 and 36 being sandwiched between the interconnecting plate 32 and the printed circuit units 28 and 30 respectively. The solder 76 may be separate pre-forms which are placed in the holes 72 and 74 of the insulating sheets 34 and 36, or can be coatings previously applied to the terminal areas 44, 46, 58 and 60 of the printed circuit units 28 and 30 and/or the terminal areas 70 of the interconnecting plate 32. The assembly is then placed in an oven and heated to a temperature which will melt the solder 76 which flows to engage the terminal areas 44, 46, 58, 60 and 70. The assembly 26 is then cooled to harden the solder 76 which then electrically and mechanically connects the terminal areas 44, 46, 58 and 60 to the terminal areas 70 so that the printed circuit pattern on the printed circuit unit 28 is electrically connected to the printed circuit pattern on the printed circuit unit 30 through the connectors 68. Since to assemble the stacked printed circuit assembly 26 of the present invention it is only necessary to stack the elements of the assembly one on top of the other, and then heat the assembly to melt the solder, the stacked printed circuit assembly 26 is relatively simple and inexpensive to manufacture. Also, since the elements of the printed circuit assembly 26 are placed directly one on top of the other, the completed assembly takes up a minimum amount of space.

The interconnecting plate 32 of the stacked printed circuit assembly 26 is a universal interconnecting plate since it can be used to electrically connect any type of circuit pattern on the adjacent printed circuit units. By having the conductors 70 of the interconnecting plate 32 arranged in a uniform pattern around the entire interconnecting plate 32, practically any point on the surface of one of the adjacent printed circuit units can be electrically connected to a corresponding point on the other adjacent printed circuit unit. Thus, it is only necessary to design the printed circuit patterns so that their terminal areas to be connected through the interconnecting plate 32 are placed at points which are in alignment with a conductor of the interconnecting plate. Therefore, the single construction of the interconnecting plate 32 can be used to connect various arrangements of printed circuit patterns.

The present invention may be embodied in other specific forms without departing from the spirit or essential attributes thereof and, accordingly, reference should be made to the appended claims, rather than to the foregoing specification as indicating the scope of the invention.

We claim:

1. In a printed circuit unit a plate of an electrical insulating material, said plate having at least one hole therethrough, and a conductor extending through and secured in said hole, said conductor comprising a wire of an electrically conductive metal extending through the hole in the plate with the ends of the wire being flush with the surfaces of the plate, and a binding material securing said wire to the wall of the hole.

2. A printed circuit unit in accordance with claim 1 in which the binding material is a fused glass frit filling the space between the wire and the wall of the hole.

3. A printed circuit unit in accordance with claim 1 in which the binding material is a plastic filling the space between the wire and the wall of the hole.

4. A stacked printed circuit arrangement comprising a pair of printed circuit units, each of said units including a flat plate of an electrical insulating material having a printed circuit pattern on at least one side thereof, the circuit pattern on each of said units having at least one electrically conductive terminal area, said units being stacked one over the other with the terminal areas of the circuit patterns facing each other and being in alignment, an interconnecting plate of an electrical insulating material between said printed circuit units, said interconnecting plate having at least one conductor extending therethrough and positioned in alignment between the terminal areas of said printed circuit units, said conductor comprising an electrically conducting material and a binding material securing said electrically conducting material to the interconnecting plate, a separate sheet of an electrical insulating material between each of said printed circuit units and the interconnecting plate, each of said insulating sheets having a hole therethrough at a position to expose the terminal area on the adjacent printed circuit unit to the conductor of the interconnecting plate, and electrically conductive solder electrically connecting the terminal area of each of the printed circuit units to the conductor of the interconnecting plate, said solder extending through the holes in the insulating sheets.

5. A stacked printed circuit arrangement in accordance with claim 4 in which the interconnecting plate has a plurality of conductors extending therethrough.

6. A stacked printed circuit arrangement in accordance with claim 5 in which the conductors through the interconnecting plate are arranged in a uniform manner in aligned rows and columns.

References Cited in the file of this patent

UNITED STATES PATENTS

| | | |
|---|---|---|
| 2,353,061 | Oldenboom | July 4, 1944 |
| 2,593,479 | Nieter | Apr. 22, 1952 |
| 2,711,983 | Hoyt | June 28, 1955 |
| 2,752,537 | Wolfe | June 26, 1956 |
| 2,754,486 | Hathorn | July 10, 1956 |
| 2,758,256 | Eisler | Aug. 7, 1956 |
| 2,864,156 | Cardy | Dec. 16, 1958 |
| 2,889,532 | Slack | June 2, 1959 |

FOREIGN PATENTS

| | | |
|---|---|---|
| 583,285 | Great Britain | Dec. 13, 1946 |

OTHER REFERENCES

IBM (publication) Technical Disclosure Bulletin, vol. No. 3, October 1958, pages 1 and 2.